US005079116A

United States Patent [19]

Tachikawa et al.

[11] Patent Number: 5,079,116

[45] Date of Patent: Jan. 7, 1992

[54] ELECTROPHOTOGRAPHIC TYPE PRINTING PLATE PRECURSOR

[75] Inventors: Hiromich Tachikawa; Hiroaki Yokoya, both of Kanagawa; Sadao Osawa, Shizuoka, all of Japan

[73] Assignee: Fuji Photo Film Co., Ltd., Kanagawa, Japan

[21] Appl. No.: 569,246

[22] Filed: Aug. 17, 1990

Related U.S. Application Data

[63] Continuation of Ser. No. 298,729, Jan. 19, 1989, abandoned.

[30] Foreign Application Priority Data

Jan. 19, 1988 [JP] Japan .................................... 63-9045
Jan. 20, 1988 [JP] Japan .................................... 63-10455

[51] Int. Cl.$^5$ ........................ G03G 13/32; G03F 7/06

[52] U.S. Cl. ........................................ 430/49; 430/69; 430/60

[58] Field of Search ........................ 430/49, 14, 60, 61, 430/62, 63, 64, 69

[56] References Cited

U.S. PATENT DOCUMENTS 4,049,746 9/1977 Muzyczko ........................... 430/160
4,238,560 12/1980 Nakamura et al. ................. 430/162
4,606,985 8/1986 Takaya et al. ......................... 430/14

*Primary Examiner*—John Goodrow
*Attorney, Agent, or Firm*—Sughrue, Mion, Zinn, Macpeak & Seas

[57] ABSTRACT

An electrophotographic printing plate precursor which comprises a conductive support having provided thereon, in order, an intermediate layer and an electrophotographic photo-receptive layer, wherein the intermediate layer contains at least one compound having at least one amino group and at least one group selected from the group consisting of a carboxyl group, a sulfo group and a hydroxyl group, or a salt of the compound, whereby ink stains are prevented from sticking to the non-image area upon printing.

13 Claims, No Drawings

ELECTROPHOTOGRAPHIC TYPE PRINTING PLATE PRECURSOR

This is a continuation of application Ser. No. 07/298,729 filed Jan. 19, 1989, now abandoned.

FIELD OF THE INVENTION

The present invention relates to an electrophotographic printing plate precursor which contains an electrophotographic photoreceptive layer. More specifically, it relates to an electrophotographic printing plate precursor which does not cause any static on the non-image area upon printing.

BACKGROUND OF THE INVENTION

At present, presensitized plates which utilize positive-working sensitizers containing diazo compounds and phenol resins as main components, or negative-working sensitizers containing acryl series monomers or prepolymers as a main component are put to practical use as lithographic offset printing plates. However, such plates all have low sensitivity, so images are reproduced in these plates through contact exposure using as the printing master, silver salt photographic films in which the images have been recorded in advance. Through advances in computer aided image processing, mass data storage and data communication techniques, and on the other hand, electronic editing systems, wherein input, correction, editing, layout and page allotment of originals are consecutively performed by operating a computer and their resulting copies are taken out in real time as the output of terminal plotters installed in long distant places by utilizing high speed communication network or satellite communication, have been put to practical use in recent years. In particular, in the field of modern printing, in which rapidness is required, has the greatest need for an electronic editing system. In addition, in the field of keeping originals in the form of master films and reproducing printing plates therefrom as occasion arises, it is expected that originals will be stored in recording media in the form of digital data with the development of recording media having very large capacity, such as optical discs.

However, scarcely and direct reproduction system for making printing plates directly from the output of a terminal plotter has been put to practical use as yet. In the present situation, though an electronic editing system is at work, yet the output is recorded in a silver salt photographic film, and the resulting film is superposed on a presensitized plate and subjected to contact exposure, whereby indirectly recording the output in the presensitized plate to make a printing plate. This is because it is difficult to develop direct reproduction type printing plates having sensitivities high enough to make printing plates in a practical time using the output of a plotter as light source (e.g., He-Ne laser, semi-conductor laser).

Under these circumstances, electrophotographic photoreceptors are expected to be useful as photosensitive materials having high sensitivities to provide direct reproduction type printing plates.

As for the printing plate materials (printing masters) utilizing electrophotography, there are known zinc oxide-resin dispersion type offset printing plate materials disclosed, for example, in JP-B-47-47610 (The term "JP-B" as used herein means an "examined Japanese patent publication"), JP-B-48-40002, JP-B-48-18325, JP-B-51-15766 and JP-B-51-25761. In using these materials as printing plates, toner images are formed on the material by the electrophotography, and then the materials are dampened with a desensitizing solution such as an acidic aqueous solution containing a ferrocyanide or a ferricyanide in order to desensitize the non-image area. Although the thus processed offset printing plates have a printing impression typically in the order of from 5,000 to 10,000 sheets, they are unsuitable for printing in which a printing impression higher than the above-described order is required. Moreover, when designed so as to have compositions suitable for desensitization, the plate materials suffer from deterioration of their electrostatic characteristics and produce images of aggravated qualities. Furthermore, the desensitizing solutions used in making the printing plates have the disadvantage of containing harmful cyanides.

In organic photoconductor-resin coated plate materials as disclosed, for example, in JP-B-37-17162 (U.S. Pat. No. 3,139,338), JP-B-38-7758 (U.S. Pat. No. 3,236,640), JP-B-46-39405 (U.S. Pat. No. 3,944,417), electrophotographic photoreceptors of the type which comprise a grained aluminum plate having provided thereon a photoconductive, electrically insulating layer containing, e.g., an oxazole or oxadiazole compound bonded with a styrene-maleic anhydride copolymer are employed. After toner images are formed on those photoreceptors through electrophotography, the non-image area is removed by dissolving it in an alkaline organic solvent to make a printing plate.

On the other hand, the present inventors disclosed electrophotographic presensitized plate materials containing a hydrazone compound and barbituric acid or thiobarbituric acid in JP-A-57-147656 (U.S. Pat. No. 4,500,622) (the term "JP-A" as used herein means an "unexamined published Japanese patent application"). In addition to these plate materials, electrophotographic printing plates sensitized with dyes are disclosed, for example, in JP-A-59-152456, JP-A-59-168462 and JP-A-58-145495. However, these plates are unsatisfactory because the non-image area is adsorbed by ingredients of the electrophotographic photoreceptive layer and becomes contaminated therewith. Also, ink becomes attached to the non-image area of the print, which causes staining of the print, rendering it unusable. To solve this problem, methods for rendering the conductive support hydrophilic by using a physical or chemical means, such as for example, soaking the anodically oxidized surface of an aluminum support in an alkali metal salt of silicic acid, disclosed in U.S. Pat. No. 3,181,461, have been proposed. However, these methods have proved unsatisfactory.

In regard to the so-called lithographic printing plates (presensitized plates), proposals have been disclosed in U.S. Pat. No. 3,860,426, British Patent 2,098,627, JP-B-44-6410 (U.S. Pat. No. 3,634,078), JP-A-60-149191 and JP-A-60-232998 for both the prevention of stain and enhancement of printing durability. However, the image formation in the presensitized plate is achieved by using an o-quinonediazide compound, a diazo compound, a photo-polymerizing system or the like to cause a change in solubility of the light-sensitive layer itself.

Various methods for reducing stains on the electrophotographic printing plates have been proposed. For instance, such methods include the use of casein, polyvinyl alcohol, ethyl cellulose, phenol resin, styrenemaleic anhydride copolymer or polyacrylic acid for the purpose of improvements in adhesiveness and electrophotographic characteristics as disclosed in JP-A-57-147656. Although it is generally said that the hydrophilic strength of the support and the printing durability (adhesiveness between the support and the photoreceptive layer) have a reciprocal relationship to each other, JP-A-59-45458 discloses the use of definite amounts of polyacrylic acid as an interlayer for the purpose of simultaneous improvement in both the aforesaid properties. In addition, JP-A-56-19063 discloses a method of coating a photoconductive pigment with a resin for the purpose of prevention of staining. However, effects brought about by such methods have been found to be unsatisfactory.

SUMMARY OF THE INVENTION

A first object of the present invention is to provide an electrophotographic printing plate precursor which does not cause any stain on the non-image area upon printing.

A second object of the present invention is to provide an electrophotographic printing plate precursor having a sufficiently high sensitivity to make a printing plate directly by the use of a laser, for example.

Yet another object of the present invention is to provide an electrophotographic printing plate precursor which has excellent electrostatic characteristics.

The above-described objects of the present invention are attained with an electrophotographic printing plate precursor which comprises a conductive support having provided thereon, in order, an intermediate layer and an electrophotographic photo-receptive layer, wherein the intermediate layer contains at least one compound having at least one amino group and at least one group selected form the group consisting of a carboxyl group, a sulfo group and a hydroxyl group, and a salt of said compound.

The electrophotographic printing plate according to the present invention forms images therein by removing the photoconductive layer with an etching solution while utilizing the toner image formed through electrophotography as resist. Thus, the plate of the present invention differs essentially from conventional presensitized plates.

DETAILED DESCRIPTION OF THE INVENTION

Conductive supports which can be employed in the present invention are those having hydrophilic surfaces. Specific examples thereof include plastic sheets having conductive surfaces, paper sheets to which have a high permeability barrier to solvents and conductivity, an aluminum plate, a zinc plate, bimetal plates such as a copper-aluminum plate, a copper-stainless steel plate, a chromium-copper plate, etc., and trimetal plates such as a chromium-copper-aluminum plate, a chromium-lead-iron plate, a chromium-copper-stainless steel plate, etc. A preferred thickness of the conductive support plate ranges from about 0.1 to about 3 mm, more preferably from about 0.1 to about 0.5 mm. Among these supports, an aluminum plate having an anodically oxidized coat is preferred.

Aluminum plates which can be used in the present invention include pure aluminum plates, and plates of aluminum alloys containing aluminum as a main component and trace amounts of other elements. Suitable examples of such other elements include silicon, iron, manganese, copper, magnesium, chromium, zinc, bismuth, nickel and titanium. In the alloy composition, the total content of other elements is preferably about 10 wt % or less. Though the aluminum material best suited for the present invention is pure aluminum, completely pure aluminum is difficult to produce in terms of the refining technique. Accordingly, aluminum materials containing other elements in the least possible amounts are also desirable. However, if the aluminum alloys have the above-described range of compositions, they can be used in the material of the present invention. Thus, an aluminum plate to be used in the present invention is not always required to have a particular composition, and can be suitably chosen from known, conventionally used materials.

In order to remove rolling oil from the surface of an aluminum plate, the plate can be optionally subjected to a degreasing treatment with a surface active agent or an alkaline aqueous solution prior to a graining treatment. After the degreasing treatment, the aluminum plate is subjected to a graining treatment.

Methods for the graining treatment include a method of roughening the surface by mechanical means, a method of dissolving the surface by electrochemical means, and the method of selectively dissolving the surface by a chemical means. In mechanically roughening the surface, known methods such as a ball graining method, a brush graining method, a blast graining method, buff graining method etc. can be employed. In the electrochemical method, the surface is roughened in an electrolytic solution of hydrochloric acid or nitric acid by passing an alternating or direct electric current therethrough. Also, a combination of these two methods can be employed as disclosed in JP-A-54-63902.

The roughened aluminum plate is then subjected to an alkali etching treatment, and then to a neutralizing treatment, if desired.

Further, the thus treated aluminum plate is subjected to anodic oxidation. Suitable examples of electrolytes to be used in the anodic oxidation treatment include sulfuric acid, phosphoric acid, oxalic acid, chromic acid, and mixed acids of two or more thereof. The most appropriate electrolyte and its optimal concentration are determined depending on the kind thereof. The most appropriate condition for the anodic oxidation cannot be absolutely determined, because it varies widely depending on the electrolyte used. Generally, however, an electrolyte concentration of from about 1 to about 80 wt %, a temperature of the electrolytic solution from about 5° C. to about 70° C., a current density of from about 5 to about 60 $A/dm^2$, a voltage of from about 1 to about 100 V and an electrolysis time of from about 5° C. to about 70° C. from about 10 seconds to about 50 minutes can be used.

A preferred coverage of the anodically oxidized coat ranges from about 0.1 to about 10 $g/m^2$, more preferably, from about 12 to about 6 $g/m^2$.

Onto the anodically oxidized coat of the aluminum plate whose surface has been subjected one or more of the various treatments as described above, a solution of a hydrophilic compound, as described below, dissolved in water or an organic solvent is coated, and then dried to from an intermediate layer. Thus, the support for the printing plate of the present invention is obtained.

Compounds to be used for the intermediate layer of the present invention are at least one compound containing at least one amino group and at least one group selected from the group consisting of a carboxyl group, a sulfo group and a hydroxyl group, or a salt of such compounds. These hydrophilic compounds may also have hydrophilic groups other than those described above.

It is desirable that these hydrophilic compounds have a molecular weight of from about 1,000 or less.

Specific examples of the hydrophilic compounds of the above compounds include amino acids such as glycine, alanine, valine, leucine, isoleucine, serine, threonine, cysteine, cystine, methionine, aspartic acid, glutamic acid, lysine, arginine, ornithine, phenylalanine, tyrosine, histidine, tryptophan, proline, oxyproline, parahydroxyphenylglycine, dihydroxyethylglycine, etc.; aliphatic aminosulfonic acids such as sulfaminic acid, cyclohexylsulfaminic acid, etc.; and sodium salts, potassium salts, ammonium salts and hydrochlorides of these acids; monoethanolamine, diethanolamine, trimethanolamine, tripropanolamine, triethanolamine, and their hydrochlorides, oxalates and phosphates. Among these compounds, dihydroxyethylglycine, alanine, triethanolamine and triethanolamine hydrochloride are particularly preferred.

The above-described hydrophilic compound is dissolved in an appropriate solvent, e.g., water or an alcohol, such as methanol, at a concentration of about 0.001 to about 10 wt % to prepare a coating solution. The pH of the coat formed by this solution ranges from about 1 to about 13. A suitable temperature of the coating solution is within the range of from about 10° C. to about 50° C.

The intermediate layer can contain other hydrophilic binders and/or coating aids, in addition to the above compounds. The above-described hydrophilic compounds of the present invention are contained in the intermediate layer in a proportion of at least 50% by weight, preferably 85% by weight or more, and most preferably 95% by weight or more, based on he total solid content of the intermediate layer.

Various coating methods including a dip coating method, a spin coating method, a spray coating method, a curtain coating method and the like can be employed. A preferred coverage of the hydrophilic compound ranges from about 1 to about 100 mg/m$^2$, more preferably from about 5 to about 50 mg/m$^2$, on a dry basis. The stain preventative effect of the hydrophilic compound in the non-image area decreases in proportion as the coverage thereof becomes less than about 1 mg/m$^2$, whereas the adhesion power between the photoreceptive layer and the support weakens as the coverage increases beyond about 100 mg/m$^2$, resulting in low printing impression on electrophotographic type graphic arts plate.

Before or after the intermediate layer is provided, an anodically oxidized aluminum plate can be treated with an aqueous solution of an alkali metal silicate (e.g. sodium silicate), as disclosed in U.S. Pat. No. 3,181,461.

On the intermediate layer formed on the thus processed conductive support, a conventionally used electrophotographic photoreceptive layer is provided to obtain an electrophotographic printing plate precursor according to the present invention. The photoconductive materials which can be used include a great number of inorganic and organic compounds which have been known to possess photoconductivity. Examples of inorganic photoconductive materials include selenium, selenium alloys, amorphous silicon, Cd, CdSe, CdSSe, ZnO, ZnS, and the like.

The organic photoconductive materials which can be used include the following high molecular weight materials:

(1) polyvinylcarbazole and its derivatives disclosed in JP-B-34-10966, (2) vinyl polymers disclosed in JP-B-43-18674 (U.S. Pat. No. 3,232,755) and JP-B-43-19192 (U.S. Pat. No. 3,162,532), with specific examples including polyvinylpyrene, polyvinylanthracene, poly-2-vinyl-4-(4′-dimethylaminophenyl)-5-phenyl-oxazole, poly-3-vinyl-N-ethylcarbazole;

(3) polymers disclosed in JP-B-43-19193 (U.S. Pat. No. 3,169,060), such as polyacenaphthylene, polyindene, acenaphthylene-styrene copolymer;

(4) condensed resins as disclosed in JP-B-56-13940 (U.S. Patents 3,842,038 and 3,881,922), such as pyrene-formaldehyde resin, bromopyrene-formaldehyde resin, ethylcarbazole-formaldehyde resin;

(5) various kinds of triphenylmethane polymers disclosed in JP-A-56-90883 and JP-A-56-161550.

The organic photoconductive materials include the following low molecular weight compounds:

(6) triazole derivatives disclosed in U.S. Pat. No. 3,112,197;

(7) oxadiazole derivatives disclosed in U.S. Pat. No. 3,189,447;

(8) imidazole derivatives disclosed in JP-B-37-16096;

(9) polyarylalkane derivatives disclosed in U.S. Pat. No. 3,615,402, U.S. Pat. No. 3,820,989, U.S. Pat. No. 3,542,544, JP-B-45-555 (U.S. Patent 3,542,547), JP-B-51-10983 (U.S. Pat. No. 3,963,799), JP-A-51-93224 (U.S. Pat. No. 4,127,412), JP-A-55-108667, JP-A-55-156953, JP-A-56-36656, etc.

(10) pyrazoline derivatives and pyrazolone derivatives disclosed in U.S. Patent 3,180,729, U.S. Pat. No. 4,278,746, JP-A-55-88064, JP-A-55-88065, JP-A-49-105537 (U.S. Pat. No. 3,837,851), JP-A-55-51086, JP-A-56-80051, JP-A-56-88141, JP-A-57-45545, JP-A-54-112637, JP-A-55-74546;

(11) phenylenediamine derivatives disclosed in U.S. Pat. No. 3,615,404, JP-B-51-10105, JP-A-54-83435, JP-A-54-110836, JP-A-54-119925, JP-B-46-3712, JP-B-47-28336;

(12) arylamine derivatives disclosed in U.S. Pat. No. 3,567,450, JP-B-49-35702, West German Patent (DAS) No. 1,110,518, U.S. Pat. No. 3,180,703, U.S. Pat. No. 3,240,597, U.S. Pat. No. 3,658,520, U.S. Pat. No. 4,232,103, U.S. Pat. No. 4,175,961, U.S. Pat. No. 4,012,376, JP-A-55-144250, JP-A-56-119132, JP-B-39-27577, JP-A-56-22437;

(13) amino-substituted chalcone derivatives disclosed in U.S. Pat. No. 3,526,501;

(14) N,N-bicarbazyl derivatives disclosed in U.S. Pat. No. 3,542,546;

(15) oxazole derivatives disclosed in U.S. Pat. No. 3,257,203;

(16) styrylanthracene derivatives disclosed in JP-A-56-46234;

(17) fluorenone derivatives disclosed in JP-A-54-110837;

(18) hydrazone derivatives disclosed in U.S. Pat. No. 3,717,462, JP-A-54-59143 (corresponding to U.S. Pat. No. 4,150,987), JP-A-55-52063 (U.S. Pat. No. 4,338,388), JP-A-55-52064, JP-A-55-46760, JP-A-55-85495, JP-A-57-11350, JP-A-57-148749, JP-A-57-104144, JP-A-60-186847;

(19) benzidine derivatives disclosed in U.S. Pat. No. 4,047,948, U.S. Pat. No. 4,265,990, U.S. Pat. No. 4,273,846, U.S. Pat. No. 4,299,897, U.S. Pat. No. 4,306,008;

(20) stilbene derivatives disclosed in JP-A-58-190953, JP-A-59-95540, JP-A-59-97148, JP-A-59-195658, JP-A-62-36674;

(21) monoazo, bisazo and trisazo pigments disclosed in U.S. Pat. No. 4,436,800, U.S. Pat. No. 4,439,506 JP-A-47-37543, JP-A-58-123541, JP-A-58-192042, JP-A-60-179746, JP-A-61-148453, JP-A-61-238063, JP-B-60-5941, JP-B-60-45664;

(22) phthalocyanine pigments including metallophthalocyanines and metal-free phthalocyanines, as disclosed in U.S. Pat. Nos. 3,397,086 and 4,666,802;

(23) perylene pigments disclosed in U.S. Pat. No. 3,371,884;

(24) indigo and thioindigo derivatives disclosed in British Patent 2,237,680;

(25) quinacridone pigments disclosed in British Patent 2,237,680;

(26) polycyclic quinone pigments disclosed in British Patent 2,237,678, JP-A-59-184348, JP-A-62-738;

(27) bisbenzimidazole pigments disclosed in JP-A-47-30331;

(28) squalium salt type pigments disclosed in U.S. Pat. Nos. 4,396,610 and 4,644,082; and

(29) azulenium salt type pigments disclosed in JP-A-59-53850, JP-A-61-2125412.

These organic photoconductive materials may be used in combination of two or more thereof.

Specific examples of sensitizing dyes suitable for the above-described photoconductive materials include triarylmethane dyes such as Brilliant Green, Victria Blue B, Methyl Violet, Crystal Violet, Acid Violet 6B, etc.; xanthene dyes such as rhodamine B, Rhodamine 6G, Rhodamine G Extra, Eosine S, Erythrosine, Rose Bengal, Fluoreceine, etc.; thiedene dyes such as Methylene Blue; Astrazone dyes such as C.I. basic Violet 7; cyanine dyes; pyrylium dyes such as 2,6-diphenyl-4-(N,N-di-methylaminophenyl)thiapyrylium perchlorate, benzopyrylium salts, etc.

Although some photoconductive compounds have a film-forming ability, in the electrophotographic printing plates precursors of the present invention, resin binders can be used when the photoconductive compound per se has no film-forming ability. Useful binding resins include those generally known in the electrophotographic field. In the present invention, it is necessary to finally remove the non-image area of the photoconductive layer. This removal process cannot be completely specified because it depends on variable relationships such as the solubility of the photoconductive layer in a etching solution, the efficiency of toner image in resisting an etching solution, etc. Taking into account the environment safety and other factors, however, it is desirable that aqueous solutions described below, or mixed solutions of these solutions with water-miscible organic solvents should be used. Accordingly, resin binders which can be preferably used in the present invention include high molecular compounds soluble or dispersible in etching solutions as described below.

Suitable examples of resin binders include the copolymers produced from vinyl monomers, such as acrylates, methacrylates, styrene, vinyl acetate, etc., and monomers containing a carboxylic acid or acid anhydride group, such as acrylic acid, methacrylic acid, itaconic acid, crotonic acid, maleic acid, maleic anhydride, phthalic anhydride, etc. Specific examples include a copolymer of styrene and maleic anhydride, copolymers of styrene and monoalkyl esters of maleic anhydride, methacrylic acid/methacrylate copolymers, styrene/methacrylic acid/methacrylate copolymers, acrylic acid/methacrylate copolymers, styrene/acrylic acid/methacrylate copolymers, vinyl acetate/crotonic acid copolymers, vinyl acetate/crotonic acid/methacrylate copolymers, and so on; copolymers containing two or more monomer units selected from among methacrylic acid amide, vinylpyrrolidone, phenolic hydroxy group-containing monomers; phenol resins; partially saponified vinyl acetate resins; xylene resins; and vinyl acetal resins such as polyvinyl butyral, etc.

The copolymers containing acid anhydride group- or carboxylic acid group-containing monomers as copolymerizable components, and phenol resins can be used to advantage, because they can achieve higher charge retentivity when used as the photoconductive, electrically insulating layer of an electrophotographic printing plate precursor.

Preferred copolymers containing, as a copolymerizable component, an acid anhydride group-containing monomer, include a copolymer of styrene and maleic anhydride. In addition, half esters of this copolymer can also be preferably used.

Preferred copolymers containing, as a copolymerizable component, a carboxylic acid group-containing monomer, include copolymers containing not less than two kinds of copolymerizable components selected from acrylic acid or methacrylic acid, and an alkyl acrylate or alkyl methacrylate, an aryl acrylate or aryl methacrylate, and/or an aralkyl acrylate or aralkyl methacrylate. In addition, a copolymer of vinyl acetate and crotonic acid, and a terpolymer of vinyl acetate, a vinyl ester of a carboxylic acid containing 2 to 18 carbon atoms and crotonic acid are preferred.

Among various phenol resins, novolak resins prepared from phenol, o-cresol, m-cresol or p-cresol, and formaldehyde or acetoaldehyde by condensing them under an alkaline condition are particularly preferred.

A resin binder and other additives to be used for a photoconductive layer can be added during or after the dispersion of a photoconductive material such as a pigment. The thus prepared coating composition is coated on a support using a known coating method, such as a spin coating method, a blade coating method, a knife coating method, a reverse roll coating method, a dip coating method, a rod bar coating method, a spray coating method etc., and dried to obtain an electrophotographic printing plate precursor.

Suitable examples of solvents for preparing the coating composition include halogenated hydrocarbons such as dichloromethane, dichloroethane, chloroform, etc.; alcohols such as methanol, ethanol, etc.; ketones such as acetone, methyl ethyl ketone, cyclohexanone, etc.; glycol ethers such as ethyleneglycol monomethyl ether, 2-methoxyethyl acetate, etc.; ethers such as tetrahydrofuran, dioxane, etc.; and esters such as ethyl acetate, butyl acetate, etc.

The electrophotographic printing plate can generally be prepared by a known process. Specifically, the process for forming an electrostatic latent image comprises substantially uniform electrification in the dark, and then imagewise exposure. Examples of useful exposure methods include scanning exposure using semiconductor lasers, He-Ne laser or the like, reflex type imagewise exposure using a xenon lamp, a tungsten lamp, a fluorescent lamp or the like as a light source, and contact exposure through a transparent positive film. Then, the foregoing electrostatic latent image is developed with toner. Various known developing methods, e.g., cascade development, magnetic brush development, powder crowd development and liquid development can be used. Among these methods, liquid development is most suited for the plate-making because fine images can be formed thereby. The toner image formed can be fixed using a known fixing method, such as heat fixation, pressure fixation, solvent fixation ,and the like. The thus obtained toner image is made of function as resist, and therethrough the non-image area of the electrophotographic photoreceptive layer is removed with an etching solution to obtain a printing plate.

An etching solution which is preferably used for the printing plate of the present invention is an aqueous solution of an organic or inorganic base or its salt, or a mixture of this aqueous solution with an organic solvent. Suitable examples of organic and inorganic bases or their salts include sodium hydroxide, potassium hydroxide, sodium carbonate, sodium silicate, potassium silicate, sodium metasilicate, potassium metasilicate, sodium phosphate, potassium phosphate, ammonia, and aminoalcohols such as monoethanolamine, diethanolamine, triethanolamine and the like. Suitable organic solvents which can be mixed with the above-cited aqueous solutions are alcohols, ketones, esters, ethers, and so on. Specific examples of alcohols include lower alcohols such as methanol, ethanol, propanol, butanol and aromatic alcohols such as benzyl alcohol, phenetyl alcohol, etc.; cellosolves such as ethylene glycol, diethylene glycol, triethylene glycol, polyethylene glycol, etc.; aminoalcohols such as monoethanolamine, diethanolamine, triethanolamine, etc. Specific examples of ketones include acetone, methyl ethyl ketone, methyl isobutyl ketone, etc. Specific examples of esters include ethyl acetate, isopropyl acetate, n-propyl acetate, sec-butyl acetate, isobutyl acetate, n-butyl acetate, 1-acetoxy-2-methoxyethane, ethylene glycol diacetate, etc. Specific examples of ethers include ethyl ether, tetrahydrofuran, dioxane, 2-methoxyethanol, ethylene glycol dimethyl ether, etc. These organic solvents, though can be mixed with the foregoing aqueous solutions in any ratios, are preferably used in proportions of not more than 90 wt % based on the total weight of the mixed solutions. To these etching solutions may be added a surface active agent, a defoaming agent, a coloring agent and so on, if desired.

It is desirable that toner to be used for the printing plate precursor of the present invention contain a resinous component having resistivity to the above-described etching solutions. Suitable examples of such a resinous component include acryl resins prepared from methacrylic acid, its esters or the like, vinyl acetate resins, copolymers of vinyl acetate and ethylene, vinyl chloride, etc., vinyl chloride resin, vinylidene chloride resin, vinyl acetal resins such as polyvinyl butyral, polystyrene, copolymers of styrene and butadiene, methacrylate, etc., polyethylene, polypropylene, chlorinated polypropylene, polyester resins (e.g., polyethylene terephthalate, polyethylene isophthalate, polycarbonate of bisphenol A), polyamide resins (e.g., polycapramide, polyhexamethylene adipamide, polyhexamethylene sebacamide), phenol resins, xylene resins, alkyd resins, vinyl-modified alkyd resins, gelatin, cellulose ester derivatives such as carboxymethyl cellulose, waxes, polyolefins. etc.

In addition to the photoconductive compounds and resin binders, sensitizers, plasticizers, surface active agents and other additives can be used in the present invention for the purpose of improvements in photoreceptivity of the photoconductive layer, electric characteristics including charge retaining power, elasticity, physical properties of the film coat such as the surface condition of the film coat, and the like. Specific examples of sensitizers include biphenyl, chlorinated biphenyl, o-terphenyl, p-terphenyl, dibutyl phthalate, dimethylglycol phthalate, dioctyl phthalate, triphenyl phosphate, etc.

In the present invention, an overcoat layer which can be dissolved at the time of removal of the electrophotographic photoreceptive layer can be provided on the electrophotographic photoreceptive layer, if needed, for the purpose of improving the electrostatic characteristics of the electrophotographic photoreceptive layer, development characteristics at the time of toner development, and/or image characteristics. Such an overcoat layer may be matted mechanically, or may be a resinous layer containing a matting agent. Suitable examples of matting agents include silicon dioxide, zinc oxide, titanium oxide, zirconium oxide, glass beads, alumina, starch, polymer particles (e.g., particles of polymethylmethacrylate, polystyrene, phenol resin, etc.), and those disclosed in U.S. Pat. No. 2,710,245 and 2,992,101. These matting agents may be used as mixture of two or more thereof. Resins to be used in the matting agent-containing overcoat layer are chosen depending on the etching solution to be used in combination therewith. Specific examples of resins usable in such an overcoat layer include gum arabic, glue, gelatin, casein, celluloses (e.g., viscose, methyl cellulose, ethyl cellulose, hydroxyethyl cellulose, hydroxypropylmethyl cellulose, carboxymethyl cellulose), starches (e.g. soluble starch, denatured starch), polyvinyl alcohol, polyethylene oxide, polyacrylic acid, polyacrylamide, polyvinyl methyl ether, epoxy resin, phenol resins (e.g., novolak type phenol resins), polyamide, polyvinyl butyral, etc. These resins may be used as a mixture of two or more thereof.

The present invention is now illustrated in greater detail by reference to the following examples. However, the invention should not be construed as being limited to these examples. Unless otherwise indicated, all percents, ratios, parts and the like are by weight.

EXAMPLE 1

The surface of a JIS 1050 aluminum sheet was grained with a rotary nylon brush using a pumice-water suspension as an abrasive. The surface roughness achieved (expressed in terms of the central line average roughness) was 0.5 microns. After washing with water, the aluminum sheet was etched by soaking in a 10% aqueous sodium hydroxide solution heated at 70° C. until 6 g/m$^2$ of aluminum were dissolved. After washing with water, the etched aluminum sheet was neutralized by dipping in a 30% aqueous solution of nitric acid for 1 minute, and then washed thoroughly with water. Thereafter, the sheet surface was further roughened electrolytically in a 0.7% aqueous solution of nitric acid by passing therethrough an electric current for 20 seconds in the form of a rectangular alternating wave having an anodic voltage of 13 volt and a cathodic voltage of 6 volt (as described in JP-B-55-19191). The resulting sheet was rinsed by dipping in a 50° C. solution containing 20% sulfuric acid, and then washed with water. Further, the aluminum sheet was subjected to an anodic oxidation treatment in a 20% aqueous solution of sulfuric acid until the coverage of anodically oxidized coat became 3.0 g/$m^2$, washed with water and dried to prepare a support (I).

The thus prepared support (I) was coated with a solution having the following composition, and dried at 80° C. for 30 seconds. A dry coating coverage was 10 mg/$m^2$. Thus, a support (II) was prepared.

| Coating Composition For Intermediate Layer: | |
|---|---|
| Dihydroxyethyl glycine | 0.05 parts |
| Methanol | 94.95 parts |
| Water | 5.0 parts |

Then, the following photoconductive composition was coated on each of supports (I) and (II) with a bar coater, and dried at 120° C. for 10 minutes to prepare electrophotographic printing plate precursors.

Coating Composition for Photoconductive Layer

| | |
|---|---|
| Hydrazone compound having the following formula | 25 parts |
| 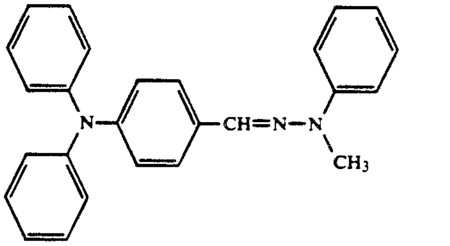 | |
| Benzyl methacrylate/methacrylic acid coplymer (methacrylic acid content: 30 mole %) | 75 parts |
| Thiopyrylium salt compound having the following formula | 1.18 parts |
| 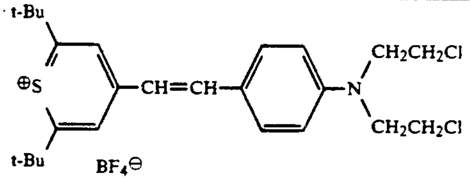 | |
| Methylene chloride | 510 parts |
| Methyl cellosolve acetate | 150 parts |

The thus prepared electrophotographic printing plate precursors each had a dry coating film thickness of 4 microns.

Each of these plate samples was charged with a corona charging device in the dark to gain the surface potential of +400V, and then exposed to tungsten light, and further developed with a liquid developer Ricoh MRP (produced by Ricoh Company Ltd.). Thus, clear positive images were formed, and the toner images were fixed by heating at 120° C. for 2 minutes.

These non-image areas were removed with an etching solution prepared by diluting a mixture of 40 parts of potassium silicate, 10 parts of potassium hydroxide and 100 parts of ethanol with 800 parts of water, thoroughly washed with water, and gummed to prepare offset printing plates.

Printing was performed using these printing plates in accordance with a conventional means, and the 20,000th prints were compared with each other. According to the comparison, no stain was observed at all in the print obtained by using support (II), whereas the print obtained by using support (I) had too many stains in the non-image area for practical use.

EXAMPLE 2

The following composition for an intermediate layer was coated on support (I) as prepared in Example 1 to make support (III).

| Coating Composition for Intermediate Layer: | |
|---|---|
| β-alanine | 0.05 parts |
| Methanol | 94.95 parts |
| Water | 5.0 parts |

Then, the following composition for a photoconductive layer was coated on each of supports (I) and (III) using a bar coater, and dried at 120° C. for 10 minutes to prepare electrophotographic printing plate precursors.

Coating Composition For Photoconductive Layer

Trisazo compound having the following formula

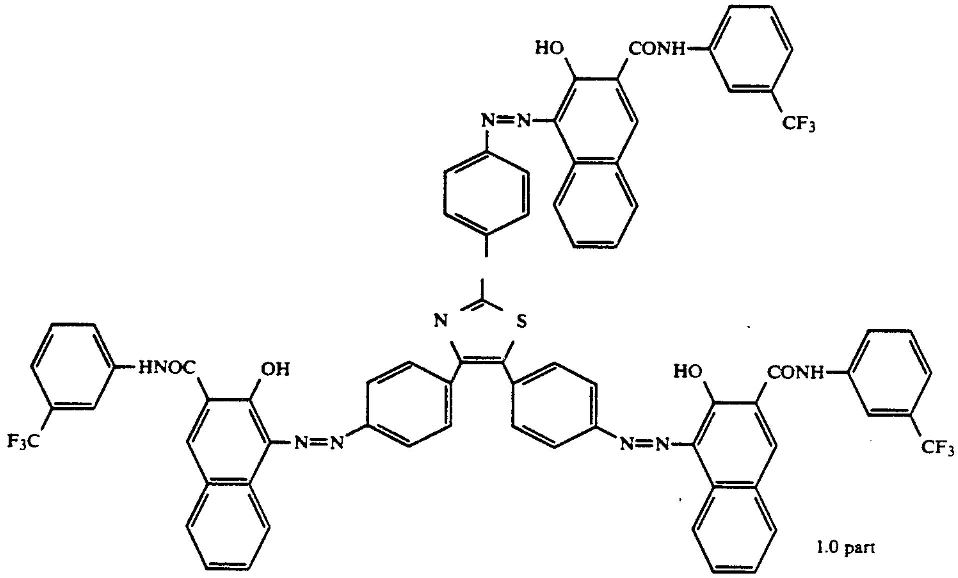

1.0 part

Oxazole compound having the following formula

| | |
|---|---|
| 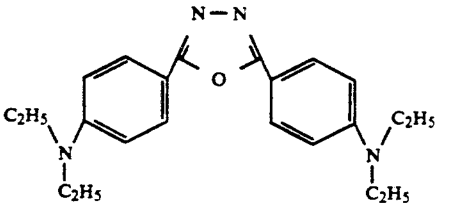 | 2.5 parts |
| Vinyl acetate/crotonic acid copolymer (RESYN No. 28-1310, produced by Kanebo NSC, Co., Ltd.) | 10 parts |
| Tetrahydrofuran | 100 parts |

The above ingredients were placed in a 500 ml glass container together with glass beads, and dispersed for 60 minutes with a paint shaker (made by Toyo Seiki Seisakusho, Ltd.) to prepare a dispersion for the photoconductive layer, which was then coated in the same manner as above.

The photoconductive layer thus formed had a dry thickness of about 4 microns. The thus obtained plate precursors were processed in the same manner as in Example 1 to make printing plates.

Printing was performed using these printing plates in accordance with a conventional means, and the 20,000th prints were compared with each other. According to the comparison, no stain was observed at all in the print obtained by using the support (III), whereas the print using the support (I) had too many stains in the non-image area for practical use.

EXAMPLE 3

A support (IV) was prepared in the same manner as in Example 1, except that glycine was used in the place of dihydroxy-ethyl glycine, and the same photoconductive layer as used in Example 1 was provided thereon. A lithographic printing plate was prepared using this electrophotographic printing plate precursor. The thus obtained printing plate produced clear prints having no stain in the non-image areas.

EXAMPLE 4

A support (V) was prepared in the same manner as in Example 2, except that lysine was used in the place of $\beta$-alanine, and the same photoconductive layer as used in Example 2 was provided thereon. A lithographic printing plate was prepared using this electrophotographic printing plate precursor. The thus prepared printing plate produced clear prints having no stain in the non-image areas.

EXAMPLE 5

A support (VI) was prepared in the same manner as in Example 2, except that aspartic acid was used in the place of $\beta$-alanine, and the same photoconductive layer as used in Example 2 was provided thereon. A lithographic printing plate was prepared using this electrophotographic printing plate precursor. The thus prepared printing plate produced clear prints having no stain in the non-image areas.

EXAMPLE 6

A support (VII) was prepared in the same manner as in Example 2, except that ornithine hydrochloride was used in the place of $\beta$-alanine, and the same photoconductive layer as used in Example 2 was provided thereon. A lithographic printing plate was prepared using this electrophotographic printing plate precursor. The thus prepared printing plate produced clear prints having no stain in the non-image areas.

EXAMPLE 7

The following dispersion for a photoconductive layer was coated on support (III) to which the intermediate layer made of $\beta$-alanine was applied and support (I) to which no intermediate layer was applied, whereby electrophotographic printing plate precursors were prepared.

| Coating Composition For Photoconductive Layer: | |
|---|---|
| $\epsilon$-type copper phthalocyanine | 1.0 part |
| Hydrazone compound: | |
| 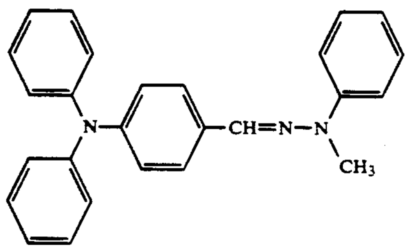 | 2.5 parts |
| Benzyl methacrylate/methacrylic acid copolymer (benzyl methacrylate fraction: 60 mol %) | 10 parts |
| Tetraphydrofuran | 100 parts |

The above ingredients were placed in a 500 ml glass container together with glass beads, and dispersed for 60 minutes with a paint shaker (made by Toyo Seiki Seisakusho, Ltd.) to prepare a dispersion for the photoconductive layer, which was coated in the same manner as above. The printing plate precursors prepared were processed as above to prepare lithographic printing plates. The printing plate using support (III) provided clear prints having no stain in the non-image areas, whereas in the case of the printing plate using support (I) too many stains were observed in the non-image area for practical use.

EXAMPLE 8

A solution having the following composition was coated on the surface of support (I) prepared in Example 1, and dried at 80° C. for 30 seconds. A dry coverage of this coating was 10 mg/m$^2$. Thus, support (VIII) was obtained.

| Coating Composition For Intermediate Layer: | |
|---|---|
| Triethanolamine | 0.05 parts |
| Methanol | 94.95 parts |
| Water | 5.0 parts |

The following coating composition for a photoconductive layer was coated on each of supports (I) and (VII) with a bar coater, and dried at 120° C. for 10 minutes to produce electrophotographic printing plate precursors.

Coating Composition For Photoconductive Layer

| Hydrazone compound having the following formula |
|---|

-continued

| | |
|---|---|
| 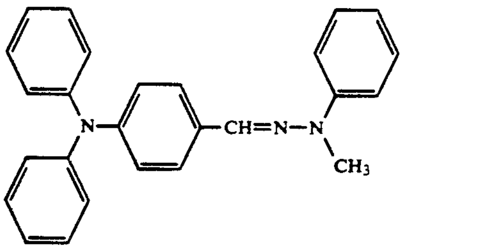 | 25 parts |
| Benzyl methacrylate/methacrylic acid coplymer (methyacrylic acid content: 30 mol %) | 75 parts |
| Thioprylium salt compound having the following formula. | |
| 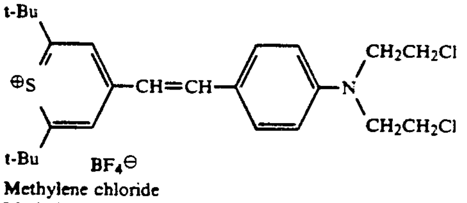 | 1.18 parts |
| Methylene chloride | 510 parts |
| Methyl cellosolve acetate | 150 parts |

The thus produced electrophotographic printing plate precursors had a coated film having a dry thickness of about 4 microns.

Offset printing plates were made using these plate precursors in the same manner as described in Example 1.

Printing was performed using these printing plates in accordance with a conventional means, and the 20,000th prints were compared with each other. According to the comparison, no stain was observed at all in the print obtained by using support (I) and too many stains in the non-image area for practical use.

EXAMPLE 9

A support (IX) was prepared by coating the following composition for an intermediate layer on support (I) prepared in Example 1.

| Coating Composition For Intermediate Layer: | |
|---|---|
| Triethanolamine hydrochloride | 0.05 parts |
| Methanol | 94.95 parts |
| Water | 5.0 parts |

The following composition for a photoconductive layer was coated on each of supports (I) and (IX) with a bar coater, and dried at 120° C. for 10 minutes to prepare electrophotographic printing plate precursor.

Coating Composition For Photoconductive Layer

Trisazo compound having the following formula

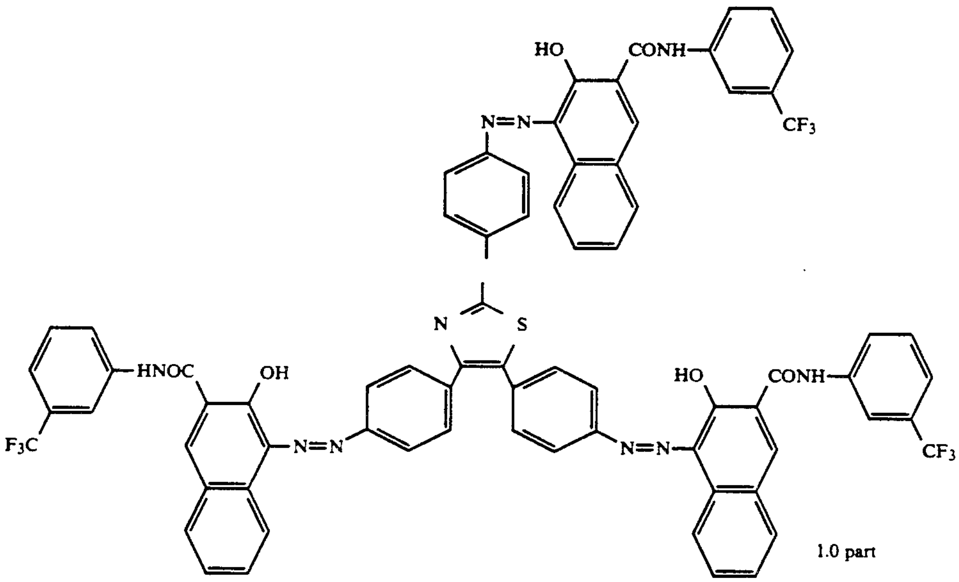

1.0 part

Oxazole compound having the following formula

| | |
|---|---|
| 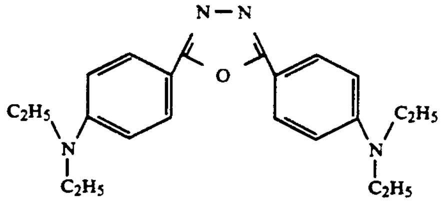 | 2.5 parts |
| Vinyl acetate/crotonic acid copolymer (RESYN no. 28-1310, trade name, produced by Kanebo NSC Co., Ltd. | 10 parts |
| Tetrahydrofuran | 100 parts |

The above ingredients were placed in a 500 ml glass container together with glass beads, and dispersed for 60 minutes with a pain shaker (made by Toyo Seiki Seisakusho, Ltd.) to prepare a dispersion for the a photoconductive layer, which was then coated in the same manner as above.

The thus formed photoconductive layer had a thickness of about 4 microns. These printing plates were processed in the same manner as in Example 8 to prepare printing plates.

Printing was performed using these printing plates in accordance with a conventional means, and the 20,000th prints were compared with each other. According to the comparison, no stain was observed at all in the print obtained by using support (IX), whereas the print obtained by using support (I) had too many stains in the non-image area for practical use.

EXAMPLE 10

A support (X) was prepared in the same manner as in Example 8, except that diethanolamine was used in the place of triethanolamine, and coated with the same photoconductive composition as prepared in Example 8. This electrophotographic printing plate was processed to make a lithographic printing plate. Clear prints, free from stains in the non-image area, were obtained using this lithographic printing plate.

EXAMPLE 11

A support (XI) was prepared in the same manner as in Example 9, except that diethanolamine was used in the place of triethanolamine hydrochloride, and coated with the same photoconductive composition as prepared in Example 9. This electrophotographic printing plate was processed to make a lithographic printing plate. Clear prints, free from stains in the non-image area, were obtained with this lithographic printing plate.

EXAMPLE 12

A support (XII) was prepared in the same manner as in Example 9, except that trimethanolamine was used in the place of triethanolamine hydrochloride, and coated with the same photoconductive composition as prepared in Example 9. This electrophotographic printing plate was processed to make a lithographic printing plate. Clear prints, free from stains in the non-image area, were obtained with this lithographic printing plate.

While the invention has been described in detail and with reference to specific embodiments thereof, it will be apparent to one skilled in the art that various changes and modifications can be made therein without departing from the spirit and scope thereof.

What is claimed is:

1. An electrophotographic printing plate precursor, which comprises a conductive support having provided thereon, in order, a release layer and an electrophotographic photoreceptive layer, said release layer containing at least one compound selected from an amino acid, an aliphatic aminosulfonic acid, an alcohol amine and a salt of said compound, wherein said compound has a molecular weight of about 1,000 or less, and wherein said electrophotographic photoreceptive layer is soluble or dispersible in an etching solution which is an aqueous solution of an organic or inorganic base or a salt thereof, or a mixture of said aqueous solution with an organic solvent.

2. An electrophotographic printing plate precursor according to claim 1, wherein said conductive support comprises an aluminum plate having an anodically oxidized coat.

3. An electrophotographic printing plate precursor according to claim 1, wherein said compound is an amino acid.

4. An electrophotographic printing plate precursor according to claim 3, wherein said compound is dihydroxyethylglycine or alanine.

5. An electrophotographic printing plate precursor according to claim 1, wherein said compound is triethanolamine or triethanolamine hydrochloride.

6. An electrophotographic printing plate precursor according to claim 1, wherein said compound is coated onto said support in a concentration of from 1 to 100 $mg/m^2$ on dry basis.

7. An electrophotographic printing plate precursor according to claim 2, wherein said anodically oxidized aluminum plate is treated with an aqueous solution of an alkali metal silicate prior to coating of said intermediate layer thereon.

8. An electrophotographic printing plate precursor according to claim 1, wherein said amino acid is selected from glycine, alanine, valine, leucine, isoleucine, serine, threonine, cysteine, cystine, methionine, aspartic acid, glutamic acid, lysine, arginine, ornithine, phenylalanine, tyrosine, histidine, tryptophan, proline, oxyproline, parahydroxyphenylglycine and dihydroxyethylglycine, and a sodium salt, a potassium salt, an ammonium salt or a hydrochloride thereof.

9. An electrophotographic printing plate precursor according to claim 1, wherein said aliphatic aminosulfonic acid is selected from sulfamic acid, cyclohyxysulfamic acid, and a sodium salt, a potassium salt, an ammonium salt and a hydrochloride thereof.

10. An electrophotographic printing plate precursor according to claim 1, wherein said alcohol amine is selected from monoethanolamine, diethanolamine, trimethanolamine, tripropanolamine, triethanolamine, and a hydrochloride, an oxalate and a phosphate thereof.

11. An electrophotographic printing plate precursor according to claim 8, wherein said amino acid is dihydroxyethylglycine or alanine.

12. An electrophotographic printing plate precursor according to claim 10, wherein said alcohol amine is triethanolamine or triethanolamine hydrochloride.

13. A method for forming a lithographic printing plate, comprising:

forming an electrostatic image on an electrophotographic printing plate precursor comprising a conductive support having provided thereon, in order, a release layer and an electrophotographic photoreceptive layer, said release layer containing at least one compound selected from an amino acid, an aliphatic aminosulfonic acid, an alcohol amine and a salt of said compound, wherein said compound has a molecular weight of about 1,000 or less, and wherein said electrophotographic photoreceptive layer is soluble or dispersible in an etching solution which is an aqueous solution of an organic or inorganic base or a salt thereof, or a mixture of said aqueous solution with an organic solvent, developing to form a toner image, fixing the toner image, and removing the intermediate layer and electrophotographic photoreceptive layer from the non-image area with said etching solution.

* * * * *